United States Patent [19]

Monteleone et al.

[11] Patent Number: 4,779,054
[45] Date of Patent: Oct. 18, 1988

[54] DIGITAL INPHASE/QUADRATURE PRODUCT DETECTOR

[75] Inventors: Veronika M. Monteleone, Stockholm; Richard P. Perry, Cherry Hill; Bede Liu, Princeton, all of N.J.

[73] Assignee: General Electric Company, Moorestown, N.J.

[21] Appl. No.: 85,681

[22] Filed: Aug. 17, 1987

[51] Int. Cl.[4] .................... H03D 1/00; H03D 3/00
[52] U.S. Cl. ............................ 329/50; 329/122; 329/126; 375/94
[58] Field of Search ............... 329/50, 104, 107, 109, 329/122, 124, 126; 375/80, 94

[56] References Cited

U.S. PATENT DOCUMENTS

| | | | |
|---|---|---|---|
| 3,617,719 | 11/1971 | Wong et al. ...................... | 235/152 |
| 3,950,750 | 4/1976 | Churchill et al. ................ | 343/17.7 |
| 4,003,054 | 1/1977 | Goldstone ........................ | 343/17.7 |
| 4,011,438 | 3/1977 | Aufderheide et al. ............ | 235/152 |
| 4,190,802 | 2/1980 | Levine ............................. | 329/104 X |
| 4,594,555 | 6/1986 | Hilton ............................. | 329/126 X |
| 4,634,989 | 1/1987 | Mehrgardt ....................... | 329/126 X |

Primary Examiner—Siegfried H. Grimm
Attorney, Agent, or Firm—Clement A. Berard, Jr.; William H. Meise; Raymond E. Smiley

[57] ABSTRACT

The detector is responsive to a modulated intermediate frequency (IF) or radio frequency (RF) signal for producing four sample signals spaced at 90° one-quarter IF (or RF) cycle apart, the first and third sample signals corresponding to the amplitude of the IF signal and its negative value, respectively, the stream of such sample signals corresponding to the inphase component of the IF signal; the fourth and second sample signals corresponding to the amplitude of the IF signal and its negative value, respectively, the stream of such sample signals corresponding to the quadrature component of the IF signal.

4 Claims, 2 Drawing Sheets

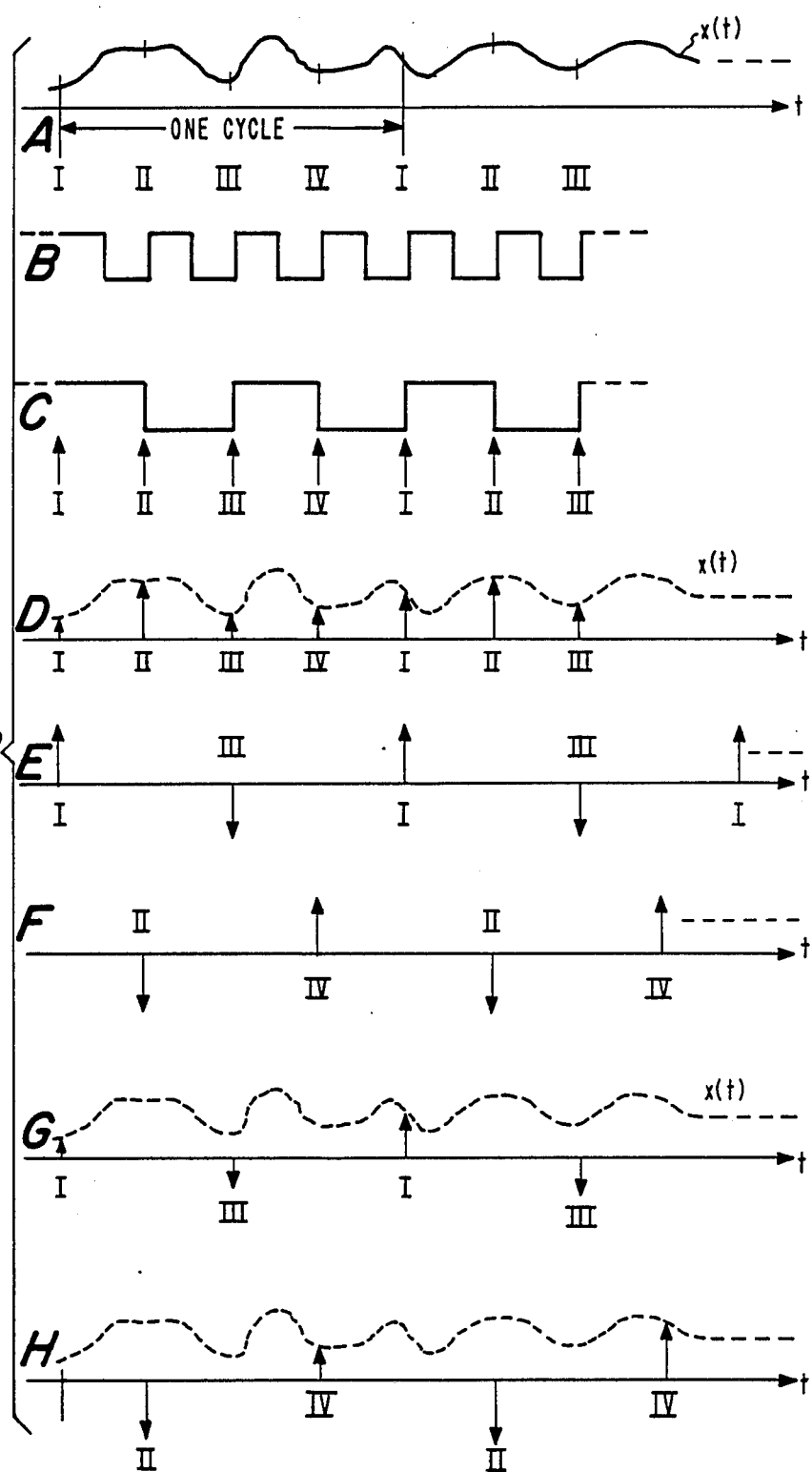

DIGITAL INPHASE/QUADRATURE PRODUCT DETECTOR

The Government has rights in this invention pursuant to Contract No. N00024-76-C-5130 awarded by the Department of the Navy.

BACKGROUND OF THE INVENTION

1. Field of Invention

This invention is concerned with apparatus for producing inphase (I) and quadrature (Q) components of a modulated baseband input signal, and more particularly, with such apparatus utilizing digital techniques.

2. Description of the Prior Art

In many radar, sonar, and communication systems, product detectors are used to demodulate a radio frequency (RF) or an intermediate frequency (IF) signal into its inphase and quadrature components at baseband. These I and Q components, as they are commonly called, are then sampled for subsequent processing. Conventionally, the demodulation and sampling are performed using two mixers (90° out of phase relative to one another), appropriate low pass filters, and analog-to-digital converters. If, however, the characteristics of the components in the two branches or channels (I and Q) are not precisely matched, distortions will result. The distortions may severely affect the performance of the overall system.

SUMMARY OF THE INVENTION

In accordance with a preferred embodiment of the present invention, an apparatus for converting a modulated analog signal into digital samples of the baseband inphase (I) and quadrature (Q) components comprises in combination, means for producing successive digital samples of the analog signal synchronized to the frequency of the IF carrier with four samples per carrier cycle, successive samples spaced one-fourth of the cycle time apart, identified by the numerals I, II, III, and IV, respectively. A first means is responsive to the digital sample I of each cycle for producing a digital signal of value directly proportional to the value of I and responsive to the digital sample III of each cycle for producing a signal of value negatively proportional to the value of III, the stream of such signals representing the I component of said modulated carrier analog signal. A second means is responsive to the digital sample II of each cycle for producing a digital signal of value negatively proportional to the value of II and responsive to the digital sample IV of each cycle for producing a digital signal of value proportional to the value of IV, the stream of such signals representing the Q component of said modulated carrier analog signal.

BRIEF DESCRIPTION OF THE DRAWING

FIG. 2 is a set of eight waveforms useful in understanding the operation of the apparatus of FIG. 1.

DETAILED DESCRIPTION

Figure 1:
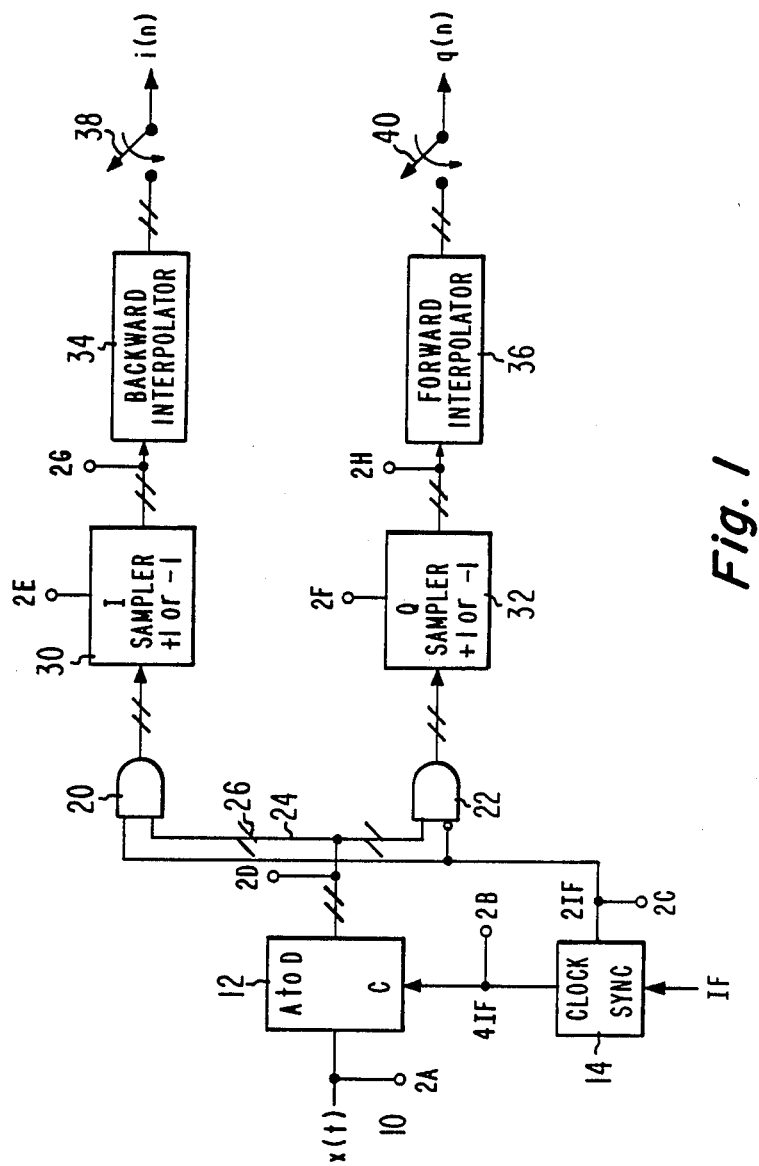
FIG. 1 is a digital I and Q products detector apparatus in block and logic form in accordance with a preferred embodiment of the present invention.

In FIG. 1, relevant signals at terminals such as 10 are illustrated in the associated waveforms of FIG. 2. Thus, the "2A" at terminal 10 refers to the waveform A of FIG. 2. The input signal x(t) illustrated in FIG. 2A as a plot of amplitude versus time is a real signal which may be a radar, sonar, or communication systems return signal, for example, at intermediate frequency (IF) containing inphase and quadrature components. The spectrum of x(t) must be sufficiently low in bandwidth to preclude having an spectral foldover due to sampling. Specifically, it must have negligible energy outside the frequency band from one-half IF to three-halves IF. The sampling rate is four times IF.

For example, one exemplary intermediate frequency is 10 MHz with a bandwidth of 10 MHz (or ±5 MHz, about the center frequency) leaving a 10 MHz guard band between the spectral edges. An analog-to-digital converter (A/D) 12 is coupled to receive signal x(t). A/D 12 also has a clock (C) input receptive of clock signals from a clock source 14. Clock source 14 is synchronized to the intermediate frequency, IF, which is the same intermediate frequency in signal x(t) or synchronized thereto.

Clock 14 produces two output signals, one at a frequency 4IF, as illustated in waveform 2B, coupled to the C input of A/D 12 and one at frequency 2IF, as illustrated in waveform 2C, coupled to the non-inverting enable input and inverting enable input, respectively, of gates 20 and 22. The output of A/D 12 is also coupled via multiconductor connection 24 to the same gates 20 and 22. The double crosshatch symbol 26 on multiconductor connection 24 and elsewhere in FIG. 1 indicates such a multiconductor connection. The value of the signal at the output of the A/D 12 is illustrated as waveform 2D represented by the length of arrows numbered I, II, III, IV. Waveform x(t) is shown (dashed) for convenience. It should be realized that A/D 12 is really producing a series of 1's and 0's on its multiconductor cable 24 but waveform 2D represents the value of such signals at sequential points in time.

The output of gate 20 is coupled to the input of I sampler 30. Similarly, the output of gate 22 is coupled to the input of Q sampler 32. I and Q samplers 30 and 32 may be identically constructed. Their purpose is to, in effect, multiply every other input value by $+1$ and the remaining input values by $-1$. It is not important that the multiplication be by $+1$. Other values such as $\frac{1}{2}$ or 2 will also work but the $\pm 1$ values are easiest to implement.

Waveform 2E illustrates the plus (+) and minus (−) values utilized in I sampler 30 while waveform 2F, illustrates the plus and minus values utilized in Q sampler 32. These two waveforms (2E and 2F) are derived from clock 14 and therefore are in synchronization with waveform 2C. It should be understood that although the waveforms during two IF cycles are depicted in the various ones of FIG. 2, nevertheless the signal is assumed to go on indefinitely. The output of I sampler 30 is as illustrated in waveform 2G. Similarly, the output of Q sampler 32 is as illustrated in waveform 2H.

It will be realized that the various arrows in waveforms 2G and 2H depict what in reality is realized in digital binary form. It will be further realized that the samples appearing at the output of I sampler 30 and at the output of Q sampler 32, although representative of the inphase (real) and quadrature (imaginary) components of the return signal, are 90° out of phase with each other. It is desirable, though not absolutely necessary for purpose of further signal processing, that the signals be brought into phase. This rephasing can be done by any of three methods;

1. Interpolate back half a sampling period in the I channel;

2. Interpolate forward half a sampling period in the Q channel;

3. Interpolate back one-quarter sampling period in the I channel; and interpolate forward one-quarter sampling period in the Q channel.

FIG. 1 illustrates apparatus for performing the latter interpolation. The forward and backward interpolation may typically be accomplished by utilizing filters of the type known as finite impulse response (FIR) filters. Such filters are described in several textbooks including "Multirate Digital Signal Processing," by R. E. Crochiere and L. R. Rabiner, Prentice-Hall, Inc., Englewood Cliffs, N.J., 1983, in Chapter 4. The output of each of interpolators 34 and 36 are coupled to decimators illustrated schematically as switches 38 and 40. The purpose of such devices is to reduce the number of samples in half to fulfill the Nyquist value of two samples, total, per IF cycle. Such reduction in the amount of data per cycle is not necessary, but on the other hand, keeping the data adds no useful information. The resulting inphase and quadrature output signals indicated as i(n) and q(n) respectively are coupled to further processing apparatus (not shown) but of conventional design.

In operation, a return modulated signal at IF is applied to A/D 12. A/D 12 produces at its output on multiple conductor 24 digital sample signals, there being four samples per IF cycle as controlled by clock source 14. Clock source 14 is synchronized by the IF signal itself. The four samples are separated by one-quarter of the IF cycle. For convenience in describing those four samples for each cycle, they can be denoted arbitrarily, in order, I, II, III, and IV, respectively. The first sample, I, of an exemplary IF cycle appears at both gates 20 and 22. However, at that time since the 2IF output of clock 14 (waveform 2C) is high, only gate 20 is enabled. In accordance with the vector illustrated in waveform 2E at sample time I, the signal from A/D 12 is multiplied by one, producing a digital signal equivalent in value to the amplitude of the signal illustrated in waveform 2G at sample time I and passed to interpolator 34.

The second sample II at one-quarter IF period after sample I appears at both gates 20 and 22. However, at that time, since the 2IF signal output (waveform 2C) from clock 14 is low, only gate 22 is enabled. In accordance with the vector illustrated in waveform 2F at sample II time, the signal from A/D 12 is multiplied by −1 producing a digital signal equivalent in value to the amplitude of the signal illustrated in FIG. 2H at sample II time. That is, whatever is the digital value of the II signal sample produced by A/D 12, is multiplied by −1 in Q sampler 32 to produce a signal of value as illustrated at sample time II in waveform 2H and passed to interpolator 36.

Similar actions occur at sample times III and IV and at sample times I, II, III, and IV of other cycles of the IF input signal. The samples, as a group, which appear at terminal 2G are a digital representation of the inphase components of the signal appearing at terminal 10 while the samples, as a group, which appear at terminal 2H are a digital representation of the quadrature component of the signal appearing at terminal 10.

Although the signals are quite useable as they appear at terminals 2G and 2H, respectively, they are offset in time by one-quarter of the IF period. Interpolators 34 and 36 correct this discrepancy by forward interpolating inphase samples by one-eighth of the IF period and backward interpolating quadrature samples by one-eighth of the IF period. According to the Nyquist criteria, little useful information is obtained by having more than two samples per IF cycle but here four samples per cycle are taken to allow for the forward and backward interpolation. Switches 38 and 40 are opened every other signal time to remove the unnecessary signal samples after interpolation.

What is claimed is:

1. An apparatus for converting a modulated ratio frequency (RF) or intermediate frequency (IF) carrier analog signal into digital samples of baseband inphase (I) and quadrature (Q) components comprising, in combination:

means for producing successive digital samples of the analog signal synchronized to the frequency of said carrier analog signal with four samples per carrier cycle, successive samples spaced 90° apart, identified by the numerals I, II, III, and IV, in order respectively;

first means responsive to the digital sample I of each cycle for producing a digital signal of value directly proportional to the value of I and responsive to the digital sample III of each cycle for producing a signal of value negatively proportional to the value of III, the stream of such signals representing the I component of said modulated carrier analog signal; and second means responsive to the digital sample II of each cycle for producing a digital signal of value negatively proportional to the value of II and responsive to the digital sample IV of each cycle for producing a digital signal of value proportional to the value of IV, the stream of such signals representing the Q component of said modulated carrier analog signal.

2. The combination as set forth in claim 1 further including third means responsive to the sample signals produced by said first and second means for producing signal samples corresponding to the inphase and quadrature signals produced by said first and second means but in timed alignment with each other.

3. The combination as set forth in claim 2 further including means for discarding every other inphase sample signal produced by said third means and for discarding every other quadrature sample signal produced by said third means.

4. The combination as set forth in claim 1 further including third means responsive to the sample signals produced by said first and second means for producing signal samples corresponding to the inphase and quadrature signals produced by said first and second means but in timed alignment with each other.

* * * * *